United States Patent [19]

Hine

[11] Patent Number: 4,579,621

[45] Date of Patent: Apr. 1, 1986

[54] SELECTIVE EPITAXIAL GROWTH METHOD

[75] Inventor: Shiro Hine, Itami, Japan

[73] Assignee: Mitsubishi Denki Kabushiki Kaisha, Tokyo, Japan

[21] Appl. No.: 624,361

[22] Filed: Jun. 25, 1984

[30] Foreign Application Priority Data

Jul. 8, 1983 [JP] Japan ................. 58-125236

[51] Int. Cl.$^4$ ............................................. C30B 23/04
[52] U.S. Cl. ..................... 156/612; 156/644; 156/646; 156/DIG. 111
[58] Field of Search ............ 156/612, DIG. 111, 644, 156/646; 148/175

[56] References Cited

U.S. PATENT DOCUMENTS 4,444,617 4/1984 Whitcomb ........................ 156/646
4,473,435 9/1984 Zafiropoulo et al. ............ 156/646
4,482,422 11/1984 McGinn et al. .................. 156/612

OTHER PUBLICATIONS

"A New Isolation Technology for Bipolar Devices by Low Pressure Selective Silicon Epitaxy", S. Hine et al., pp. 116-117.
"Novel Device Isolation Technology with Selective Epitaxial Growth", N. Endo et al., pp. 241-244.
"CMOS Isolation Using Selective Epitaxial Regrowth", Jastrzebski et al., pp. 50-51.
Hayes et al., Solid State Technology, v. 23, No. 11, pp. 71-78.
Ru et al., J. Vac. Sci. Technology, Nov./Dec. 1981, 1385-1389.
Lam et al., Conference International Electron Devices Meeting, Technical Digest, Washington, D.C., Dec. 8-10, 1980.

Primary Examiner—Hiram H. Bernstein
Attorney, Agent, or Firm—Lowe, Price, Leblanc, Becker & Shur

[57] ABSTRACT

Disclosed herein is a selective epitaxial growth method for forming an opening, utilizing anisotropic dry etching, in a silicon oxide film formed on a silicon substrate and epitaxially growing a silicon layer selectively in the opening. The anisotropic dry etching is performed employing a mixed gas of carbon tetrafluoride and hydrogen, and the wall surface of the opening is perpendicular to the major surface of the silicon substrate. The epitaxial growth is achieved under a temperature of 900° to 1100° C. utilizing a mixed gas of a low pressure under 100 Torr. containing dichlorosilane as a silicon source and hydrogen as a carrier gas. A silicon layer thus obtained contains substantially no lattice defects such as a stacked fault.

8 Claims, 9 Drawing Figures

PRIOR ART

SELECTIVE EPITAXIAL GROWTH METHOD

BACKGROUND OF THE INVENTION

1. Field of the Invention

The present invention relates to a selective epitaxial growth method, and more particularly, it relates to a selective epitaxial growth method used in manufacturing of a semiconductor device.

2. Description of the Prior Art

In manufacturing of a semiconductor device such as an integrated circuit, there is often used a selective epitaxial growth method. The term "selective epitaxial growth" herein used means technique for epitaxially growing a semiconductor material on a semiconductor substrate exclusively in a desired region. Particularly important one of such technique is a method of epitaxially growing a semiconductor layer in an opening formed in an insulating film provided on a semiconductor substrate.

Such technique is disclosed in, for example, S. Hine, T. Hirao, S. Kayano and N. Tsubouchi, "A New Isolation Technology for Bipolar Devices by Low Pressure Selective Silicon Epitaxy", 1982 Symposium on VLSI Technology, Digest of Technical Papers, pp. 116–117 (1982). In this literature, there is described manufacturing of a bipolar device utilizing a selective epitaxial growth method under a low pressure and the result of measurement of the electric characteristic of the subject bipolar device. There are also disclosed manufacturing of a polysilicon gate MOS-FET utilizing a selective epitaxial growth method and the result of measurement of its electric characteristic in N. Endo et al., "Novel Device Isolation Technology with Selective Epitaxial Growth", IEDM '82, pp. 241–244 (1982). Further, in I. Jastrzebski et al., "CMOS Isolation using Selective Epitaxial Growth", 1983 Symposium on VLSI Technology, Digest of Technical Papers, pp. 50–51 (1983), there are disclosed application of a selective epitaxial growth method to isolation of a CMOS device and the result of measurement of the electric characteristic thereof.

FIGS. 1 to 4 of the drawings show a principal process of such prior art, which is now described with reference to the drawings. Epitaxial growth herein assumed is selective epitaxial growth on a silicon substrate. First, as shown in FIG. 1, a silicon substrate 1 of a first conductive type is prepared, and an insulating film 2 is formed on the major surface of the silicon substrate 1. The insulating film 2 may be silicon oxide ($SiO_2$) or silicon nitride ($Si_3N_4$). Then, utilizing a photographic process, a pattern of a resist film 3 is formed at a desired region on the insulating film 2 (FIG. 2). The exposed surface of the insulating film 2 and the resist film 3 are immersed in an etchant, whereby the former alone is selectively etched. In the etching process, the resist film 3 functions as a mask, such an etchant may be prepared by a solution containing hydrofluoric acid, when the isolation film 2 is formed by silicon oxide ($SiO_2$). When, on the other hand, the insulating film 2 is formed by silicon nitride ($Si_3N_4$), the etchant may contain $PH_2O_3$. Such an etching method is called as wet etching. After completion of the etching, the resist film 2 is removed, whereby the insulating film 2 having a desired opening 4 is obtained (FIG. 3). It is to be noted that the opening 4 is tapered toward the silicon substrate 1 since undercut is caused during the etching process around the circumference of the resist film 3.

Then, the silicon wafer in the state as shown in FIG. 3 is brought in a chemical reactor, into which a source gas having a pressure of 100 Torr. is introduced with a carrier gas. Such a source gas may contain monosilane ($SiH_4$), dichlorosilane ($SiH_2Cl_2$) or silicon tetrachloride ($SiCl_4$). By this process, as shown in FIG. 4, a silicon layer 5 of a first or second conductive type is epitaxially grown selectively on the exposed region of the silicon substrate 1, whereby the selective epitaxial growth process is completed.

By employing the aforementioned selective epitaxial growth method under a low pressure, there can be obtained a semiconductor device which is excellent in selectivity of growth and flatness of the grown silicon layer in comparison with a selective epitaxial growth method under the atmospheric pressure. However, the opening 4 of the insulating film 2 is tapered as shown in FIG. 3. Consequently, when the silicon layer 5 having thickness similar to that of the insulating film 2 is grown along the tapered surface of the opening 4, the silicon layer inevitably contains, at portions close to the tapered surface, a lattice defect 6 such as those shown by symbols x in FIG. 4. Such a lattice defect 6 is, e.g., a stacking fault, which generally arises over a length of 1 $\mu$m. In a semiconductor device having such a silicon layer 5 containing the aforementioned lattice defect 6, the electric characteristic thereof is deteriorated, leading to inferior reliability of the semiconductor device. Further, the yield in manufacturing of the semiconductor device is decreased.

SUMMARY OF THE INVENTION

An object of the present invention is to provide a selective epitaxial growth method in which arising of lattice defect is substantially prevented.

Another object of the present invention is to provide a selective epitaxial growth method which can improve, when used in a manufacturing process of a semiconductor device, the electric characteristic of the manufactured semiconductor device.

Still another object of the present invention is to provide a selective epitaxial growth method in which a semiconductor device can be obtained at an excellent yield.

For attaining the above objects, the selective epitaxial growth method according to the present invention comprises the steps of: forming an insulating film on the major surface of a semiconductor substrate; forming a resist film having a predetermined pattern on the insulating film for performing anisotropic dry etching with respect to the insulating film utilizing the resist film as a mask, thereby forming an opening in the insulating film; and exposing the semiconductor substrate to a low-pressure gas for epitaxially growing a semiconductor layer selectively in the opening.

An advantage of the selective epitaxial growth method according to the present invention is that substantially no lattice defects arise in an epitaxially grown semiconductor layer.

Another advantage of the present invention is that there is obtained a selective epitaxial growth method which can be employed in manufacturing of a semiconductor device whose electric characteristic is excellent.

Still another advantage of the present invention is that a semiconductor device can be manufactured at a high yield.

These objects and other objects, features, aspects and advantages of the present invention will become more apparent from the following detailed description of the present invention when taken in conjunction with the accompanying drawings.

DESCRIPTION OF THE PREFERRED EMBODIMENTS

The inventor of the present invention has noticed that arising of a lattice defect in a conventional selective epitaxial growth method mainly results from the fact that an opening formed in an insulating film is tapered. Accordingly, a process of forming an opening in an insulating film takes an important position in the following description of a selective epitaxial growth method according to the preferred embodiment of the present invention, which will be made with reference to FIGS. 5 to 9 of the accompanying drawings.

Figure 1:
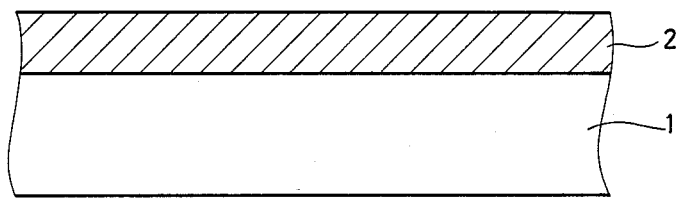
FIGS. 1 to 4 are process drawings showing a principal process of a conventional selective epitaxial growth method.
Figure 2:
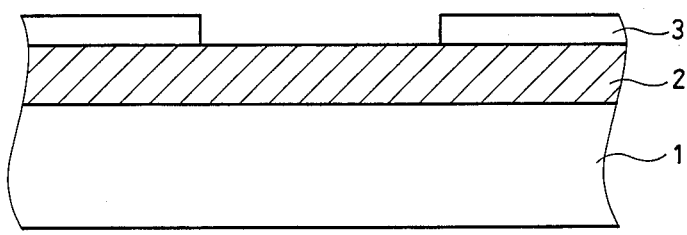
Figure 3:
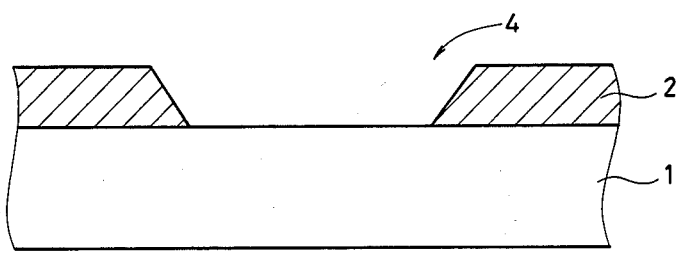
Figure 4:
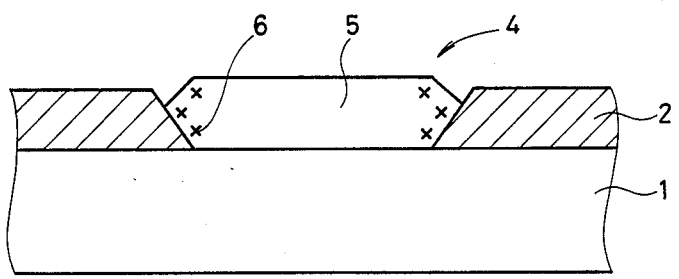
Figure 5:
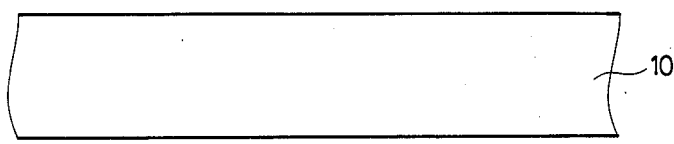
FIGS. 5 to 9 are process drawings showing a principal process of a selective epitaxial growth method according to an embodiment of the present invention.
Figure 6:
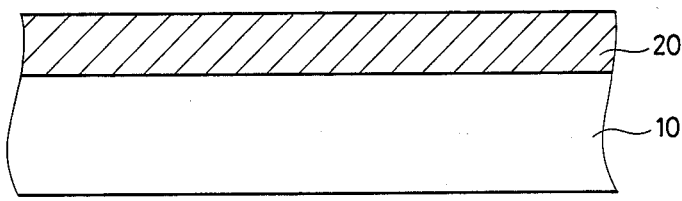
Figure 7:
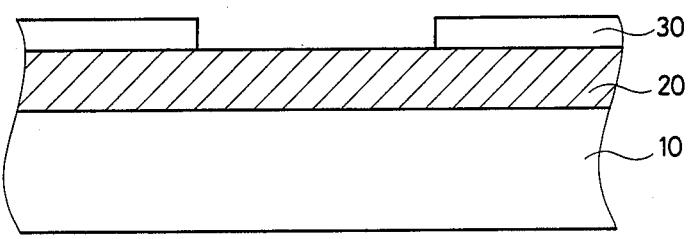
Figure 8:
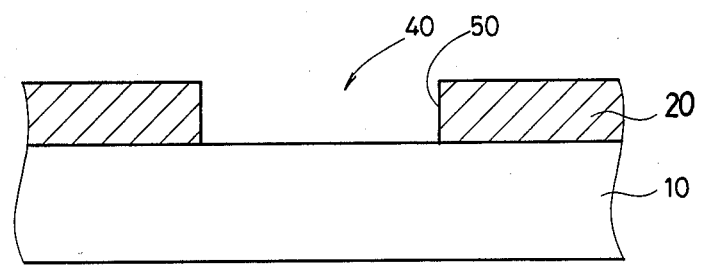

In the selective epitaxial growth method according to the preferred embodiment, a silicon substrate 10 of a first conductive type as shown in FIG. 5 is first prepared. Although an n-type is assumed here to be the first conductive type, the present invention is also applicable to a p-type silicon substrate 10 without substantially changing the following description. The silicon substrate 10 has already been provided therein with a desired active region. Then, as shown in FIG. 6, an insulating film 20 is formed on the major surface of the silicon substrate 1. The insulating film 20 may be formed by silicon oxide (SiO2) or silicon nitride (Si3N4). Forming of the insulating film 20 may be performed by a well-known method, such as a thermal oxidation process, a chemical vapor deposition process (CVD), or the like. A predetermined region on the surface of the insulating film 20 is covered by the pattern of a resist film 30 using a photographic process (See FIG. 7). The silicon wafer in this state is brought in a parallel-plane type anisotropic dry etching device, into which an etching gas is introduced. This etching gas, i.e., an etchant, is prepared as a mixed gas of, for example, carbon tetrafluoride (CF4) and hydrogen (H2). The resist film 30 functions as a mask and selective anisotropic dry etching with respect to the insulating film 20 is performed, whereby an opening 40 is formed in the insulating film 20. Such an opening 40, in a condition after the resist film 30 is removed, is shown in FIG. 8, whose wall surface 50 is caused to be perpendicular with respect to the major surface of the silicon substrate 10 by the anisotropic etching. It is to be noted that the opening 40 is no longer tapered.

Figure 9:
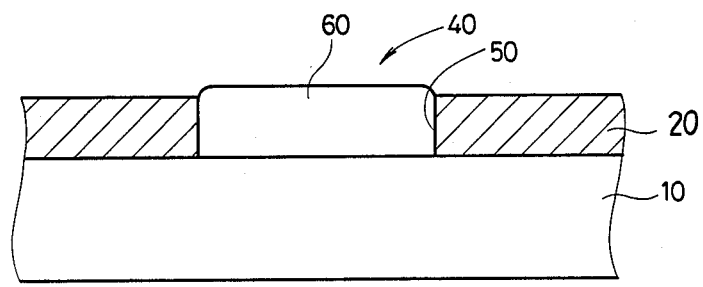

Then, the silicon wafer in the state as shown in FIG. 8 is brought in a chemical reactor, into which a mixed gas or dichlorosilane (SiH2Cl2) and hydrogen (H2) is introduced. Dichlorosilane (SiH2Cl2) functions as a silicon source, while hydrogen (H2) functions as a carrier gas. If necessary, an impurity source or dopant such as phosphine (PH3) or diborane (B2H6) may be mixed into the silicone source. The pressure of the mixed gas is determined to be under 100 Torr., while the growing temperature is determined to be 900° to 1100° C. In such a process, a silicon layer 60 extending from the major surface of the silicon substrate 10 is epitaxially grown selectively in the opening 40 of the insulating film 20 as shown in FIG. 9. The conductive type of the silicon layer 60 is determined to be an n-type or a p-type depending on the type of the impurity source.

Since the wall surface 50 of the opening 40 is perpendicular to the major surface of the silicon substrate 10, the epitaxially grown layer 60 has no inclined portion, thereby introducing substantially no lattice defects. Even if a lattice defect such as a stacking fault is introduced, the length thereof is under 5000 Å. Thus, the electric characteristic and the yield of a semiconductor device which is manufactured employing the selective epitaxial growth method according to the present invention is remarkably improved.

Although the above embodiment has been described with respect to a case where the silicon layer 60 is selectively grown on an n-type silicon substrate 10, the present invention can also be applied to a case where another type of semiconductor layer is epitaxially grown selectively on another type of semiconductor substrate. Further, performance of the anisotropic etching is not limited to the process as hereinabove described, and any process is employable provided that an opening can be formed in an insulating film to have a wall surface which is substantially perpendicular to the major surface of a semiconductor substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A selective epitaxial growth method of epitaxially growing a semiconductor layer selectively on the major surface of a semiconductor substrate, said selective epitaxial growth method comprising the steps of:

preparing a semiconductor substrate;

forming an insulating film on the major surface of said semiconductor substrate;

forming a resist film having a predeterminied pattern on said insulating film;

utilizing said resist film as a mask for performing anisotropic dry etching with respect to said insulating film, said anisotropic dry etching being performed by utilizing a mixed gas of carbon tetrafluoride and hydrogen as an etchant to thereby form an opening in and corresponding to said pattern in said insulating film, said opening having a peripheral vertical edge extending generally perpendicular to said major surface of said semiconductor substrate; and exposing said semiconductor substrate to a low-pressure gas containing a semiconductor element, thereby expitaxially growing a semiconductor layer containing said semiconductor element selectively in said opening, said epitaxially grown semiconductor layer being generally free of lattice defects along its periphery as a result of forming said opening with said peripheral vertical edge.

2. A selective epitaxial growth method in accordance with claim 1, wherein said semiconductor substrate is a silicon substrate having an active region therein and said insulating film is a silicon oxide film.

3. A selective epitaxial growth method in accordance with claim 2, wherein
said anisotropic dry etching is performed in a parallel-plane type anisotropic dry etcing device.

4. A selective epitaxial growth method in accordance with claim 3, wherein
said semiconductor element is silicon and said low-pressure gas is a mixed gas containing dichlorosilane as a silicon source and hydrogen as a carrier gas.

5. A selective epitaxial growth method in accordance with claim 4, wherein
said low-pressure gas has a pressure under 100 Torr.

6. A selective epitaxial growth method in accordance with claim 5, wherein
said selective epitaxial growth is achieved under a temperature of 900° to 1100° C.

7. A selective epitaxial growth method in accordance with claim 6, wherein
said semiconductor substrate is of a first conductive type, and the conductive type of said semiconductor layer is determined to be either said first conductive type or a second conductive type depending on the conductive type of an impurity gas mixed into said silicon source.

8. The selective epitaxial growth method of claim 1, wherein said anisotropic etching is performed and exposure to said low-pressure gas occurs at predetermined temperatures and predetermined pressures such that lattice defects, if any, have a length of less than 5000 Å.

* * * * *